United States Patent [19]
Mirle et al.

[11] Patent Number: 5,462,835
[45] Date of Patent: Oct. 31, 1995

[54] PHOTOCURABLE COMPOSITION, FLEXIBLE, PHOTOSENSITIVE ARTICLES MADE THEREFROM, AND METHODS OF IMPROVING SOLVENT RESISTANCE AND FLEXIBILITY OF THOSE ARTICLES

[75] Inventors: Srinivas K. Mirle, Ellicott City, Md.; Trevor J. Williams, Mableton, Ga.

[73] Assignee: P T Sub Inc., Wilmington, Del.

[21] Appl. No.: 760,430

[22] Filed: Sep. 16, 1991

[51] Int. Cl.$^6$ ............................................. G03C 1/73
[52] U.S. Cl. .................... 430/287; 430/286; 430/306; 522/111
[58] Field of Search .................... 430/287, 306, 430/286; 522/111

[56] References Cited

U.S. PATENT DOCUMENTS

| | | | |
|---|---|---|---|
| 2,760,663 | 8/1956 | Plambeck, Jr. | 430/281 |
| 3,855,379 | 12/1974 | Araki et al. | 522/149 X |
| 3,974,129 | 8/1976 | De La Mare | 522/149 |
| 4,023,973 | 5/1977 | Imaizumi et al. | 96/115 R |
| 4,033,840 | 7/1977 | Fujiwara et al. | 522/149 X |
| 4,045,231 | 8/1977 | Toda et al. | 522/149 X |
| 4,272,608 | 6/1981 | Proskow | 430/288 |
| 4,275,142 | 6/1981 | Hosaka et al. | 430/271 |
| 4,857,434 | 8/1989 | Klinger | 430/286 |
| 5,102,773 | 4/1992 | Littmann et al. | 430/283 |
| 5,143,819 | 9/1992 | Mirle et al. | 430/286 |
| 5,268,257 | 12/1993 | Mirle et al. | 430/285 |

FOREIGN PATENT DOCUMENTS

| | | |
|---|---|---|
| 0183552 | 6/1986 | European Pat. Off. . |
| 0261910 | 3/1987 | European Pat. Off. . |
| 0295944 | 12/1988 | European Pat. Off. . |

*Primary Examiner*—Janis L. Dote
*Attorney, Agent, or Firm*—Woodcock Washburn Kurtz Mackiewicz & Norris

[57] ABSTRACT

An aqueous developable, photocurable composition and a method of improving solvent resistance and flexibility are disclosed. The composition comprises (a) an acid-containing copolymer having an acid ephr of at least 0.20 and (b) an acid-containing polymer suitable for flexibilizing the composition, which has at least one free ethylenically unsaturated group. It is preferable that either (a) or (b) or both are further reacted with a compound having a free ethylenically unsaturated group and a free acid reactive group, e.g. glycidyl(meth)acrylate. When the composition is formulated with an ethylenically unsaturated monomer and photoinitiator, the photocurable composition is especially suitable for use in an aqueous developable, flexible printing plate.

17 Claims, No Drawings

PHOTOCURABLE COMPOSITION, FLEXIBLE, PHOTOSENSITIVE ARTICLES MADE THEREFROM, AND METHODS OF IMPROVING SOLVENT RESISTANCE AND FLEXIBILITY OF THOSE ARTICLES

FIELD OF THE INVENTION

This invention relates to photocurable compositions, as well as photosensitive articles having solid surfaces or layers prepared from such compositions and a method of improving the solvent resistance and flexibility of those solid layers. These photocurable compositions can be made into flexographic printing plates by conventional solvent-casting, extrusion and hot press processes.

BACKGROUND OF THE INVENTION

Photocurable compositions are well known in the art for forming printing plates and other photosensitive or radiation sensitive articles. In the field of photosensitive flexographic printing plates, the plates typically comprise a support and a photocurable surface or layer. Additional layers or surfaces on the plate include slip and release films to protect the photocurable surface. Prior to processing the plate, the release layer is removed, and the photocurable surface is exposed to radiation in an imagewise fashion. The unexposed areas of the surface are then removed in developer baths.

In the past, the unexposed areas of the solid photocurable compositions such as those disclosed in U.S. Pat. No. 2,760,863 issued to L. Plambeck, Jr. on Aug. 28, 1956, were exclusively removed with developer baths comprising organic solvents. Such solvents include tetrachloroethylene, 2-butanone, benzene, toluene, xylene, trichloroethane and solvent mixtures such as tetrachloroethylene/n-butanol. However, due to the toxicity, high volatility and low flash point of such solvents, their use gave rise to hazardous conditions and pollution problems. As a result of these problems, the field has long recognized the need to provide photocurable compositions which can be developed in non-organic solvent developing solutions, e.g. aqueous, surfactant-aqueous or alkaline-aqueous solutions. However, the printing plates resulting from these recent attempts have deficiencies in mechanical properties, e.g. flexibility (See European Application 261,910) and solvent resistance.

For instance, in addition to possessing an aqueous developable photocurable surface, a flexographic printing plate must have sufficient flexibility to wrap around a printing cylinder, yet be strong enough to withstand the rigors experienced during typical printing processes. Further, the printing plate should be soft enough to facilitate ink transfer during printing. These physical properties can be characterized generally as elongation at least 100%, preferably at least 250%, tensile strength at least 200 psi, preferably at least 300 psi and Young's modulus between about 150–750 psi, preferably about 150–450 psi, with Shore A hardness about 60 or less.

As mentioned above, previous aqueous developable compositions have not possessed all the desirable features such as flexibility, softness and solvent resistance to inks, including resistance to swell by the aqueous-based inks which are typically used in flexographic printing. For example, while the printing plate described in U.S. Pat. No. 4,023,973 issued to Imaizumi et al. on May 17, 1977, is aqueous developable, it would be deficient in softness. The photosensitive composition described therein comprises a maleic anhydride adduct of a 1,2-polybutadiene and because of the high 1,2 content of this material, i.e. 70% or more, this composition has an undesirably high rubber hardness.

European Patent Application 295,944 discloses a water-developable, photopolymerizable composition made of an ethylene/acrylic acid copolymer neutralized by a nitrogen-containing compound, reactive ethylenically unsaturated monomer and photoinitiator. This composition is disclosed to be useful with oil-based and emulsified inks, not water-based inks, for letterpress printing, a process which is a forerunner of flexography, and which uses plates that are relatively inflexible and hard. The ethylene/acrylic acid copolymer will produce a harder developed image lacking in flexibility and softness.

Other water-developable photosensitive compositions such as those which contain as the main component a high molecular weight polymer such as polyvinyl alcohol, cellulose, or the like, are also insufficient in flexibility and possess a high degree of rubber hardness and hence are unsuitable for use in flexographic printing plates.

One attempt to improve the flexibility of the photocurable layer in a flexible article such as a flexographic printing plate involves the addition of a lower molecular weight butadiene copolymer which optionally contains acrylonitrile and up to 15% by weight (0.33 ephr) carboxyl groups. See U.S. Pat. No. 4,272,608 issued to Proskow Jun. 9, 1991. In particular, Proskow discloses that by adding the low molecular weight butadiene to a high molecular weight carboxylated butadiene/acrylonitrile copolymer, a softer and more flexible composition is provided. See Column 7, lines 47–48. However, while the Proskow composition is developable in organic solvent/aqueous base mixtures, the composition still requires the use of an organic solvent for development and thus could be improved in terms of aqueous developability.

A photocurable composition described in a copending application, Ser. No. 561,849, filed Aug. 1, 1990 which is now U.S. Pat. No. 5,268,257 issued Dec. 7, 1993, for "Aqueous Developable, Photocurable Composition, Process of Making Thereof and Flexible, Photosensitive Articles Made Therefrom" describes an aqueous developable, solid printing plate which is soft, flexible and resistant to swell by aqueous inks. The composition used to make the photocurable layer on that plate comprises the reaction product of a liquid or solid carboxylated elastomer, e.g. butadiene, and a photosensitive vinyl group containing compound such as glycidyl methacrylate. The reaction product is optionally reacted with anhydride. However, even though the flexibility and solvent resistance of those photocurable compositions are sufficient, they could be improved.

Another attempt to improve the ink solvent resistance involves adding a monoolefinically unsaturated comonomer to the copolymer binder resin of a photocurable composition used to make the printing plate's photosensitive layer. See U.S. Pat. No. 4,275,142 issued to Hosaka et al. Jun. 23, 1981. Suitable monoolefinically unsaturated comonomers include (meth)acrylates, styrene acrylonitrile, etc. The copolymer binder resin used by Hosaka et al. is a copolymer of a conjugated diolefinic hydrocarbon, e.g. butadiene, and α, β-ethylenically unsaturated carboxylic acid. However, the copolymerization results in the ethylenically unsaturated groups of the monoethylenically unsaturated monomer being polymerized, thus preventing those groups from crosslinking with the unsaturated groups of the reactive monomers which are later added. In the present case, the inventors have found that the copolymer becomes more solvent resistant when more crosslinkable free ethylenically unsaturated groups are present on the copolymer's backbone.

SUMMARY OF THE INVENTION

It is thus an object of this invention to provide an aqueous developable, solid photocurable composition which, when cured, has sufficient mechanical properties for use as a flexible printing plate.

It is a specific object of this invention to provide a composition which, when cured, will improve the flexibility and solvent resistance of a flexible printing plate.

These and other objects are achieved by compositions comprising (a) an acid-containing solid copolymer having an ephr of at least about 0.2 and (b) an acid-containing polymer suitable for flexibilizing the photocurable composition when cured wherein the polymer has at least one free ethylenically unsaturated group.

It is especially preferred that these compositions further comprise ethylenically unsaturated monomers and photoinitiator. It is also preferable that (a) is further reacted with a compound having a free ethylenically unsaturated group and a free acid reactive group.

DETAILED DESCRIPTION OF THE INVENTION

As indicated above, the acid-containing copolymer (a) used in this invention is solid and has an acid content of at least about 0.20 ephr. That is, it has 0.2 acid equivalents per hundred grams of resin. To achieve this acid content, the amount of acrylic or methacrylic acid collectively, "(meth)acrylic acid" required is at least 21.5% (for methacrylic) or 18% (for acrylic) by weight of the copolymer. Apparently, such a high acid content is required to give the overall formulation sufficient water dispersibility.

A particularly suitable copolymer is a butadiene/methacrylic acid copolymer having a Mooney viscosity of at least about 20 and no more than 70, and more preferably in the range of about 40 to 60. One of ordinary skill in the art will appreciate that Mooney viscosity is a rough estimate of molecular weight. The cited range is regarded as applying to a relatively high molecular weight. Such solid copolymers are prepared using well known polymerization techniques and are commercially available.

The water dispersibility and solvent resistance of the photocurable composition may also be enhanced by reacting the acid-containing copolymer (a) with a nitrogen-containing compound which has a polymerizable ethylenically unsaturated group.

Examples of such compounds include those embraced by the structural formulas I and II illustrated below.

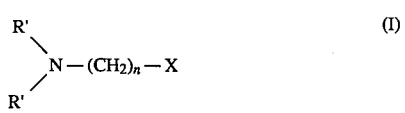

(I)

wherein X is

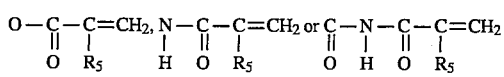

R' is hydrogen or an alkyl group containing 1 to 6 carbons, $R_5$ is hydrogen or methyl, and n is 1, 2 or 3;

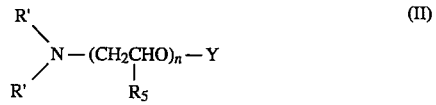

(II)

wherein Y is

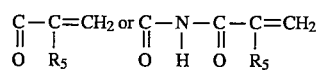

$R_5$ is hydrogen or methyl, n is in the range of 1 to 6 when R' is $CH_3$ and n is 2 to 6 when R' is $C_2H_5$.

Specific examples of compounds embraced by formulas I and II above include N,N-dimethylaminoethyl (meth)acrylate, N,N-diethylaminoethyl (meth)acrylate, t-butyl aminoethyl (meth)acrylate, N,N-dimethylaminopropyl (meth)acrylamide, N,N-dimethylaminoethyl-N'-(meth)acryloylcarbamate, or N,N-diethylamino-ethoxyethyl (meth)acrylate. The above compounds may be used alone or in combination with each other.

It is believed that addition of the nitrogen-containing compound forms a salt of the copolymer's acid groups and improves water dispersibility of the resulting photocurable composition. See European Patent Application 295,944. To achieve the desired dispersibility, the nitrogen-containing compound added should be added at an amount of about 5–18% by weight of the acid-containing copolymer. However, the amount of the nitrogen-containing compound should not be in excess of about 30% by weight. Amounts greater than that result in plates with insufficient flexibility, i.e. too hard. The conditions for this reaction, typically heating, e.g. 50° C., and mixing, are well known in the art.

Further, pendent unsaturated cross-linking sites on the backbone of copolymer (a) can also be introduced by modifying with a compound having an ethylenically unsaturated group and an acid reactive group.

The compound having the ethylenically unsaturated group and the acid group include compounds illustrated by the formula below:

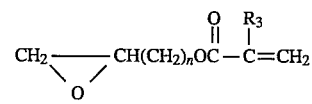

wherein n is an integer from 1 to 6 and $R_3$ is methyl or hydrogen. A preferred compound is glycidyl methacrylate (GMA). The reaction between the acid reactive group and the acid groups on copolymer (a) results in a pendent or terminal structure having a free ethylenically unsaturated group. When GMA is used, the resulting terminal or pendent group has the structure:

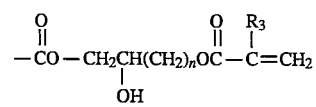

where n=1 and $R_3$ is methyl.

The compound having the ethylenically unsaturated group and acid reactive group is added in an amount sufficient to react (through the acid reactive group) with at least about one of the free carboxyl groups on the copolymer (a). However, more than one carboxyl group may be reacted through the acid reactive group depending on the number of carboxylic acid groups and the molecular weight of the copolymer (a).

In contrast, suitable copolymers (b) include low molecular weight acid-containing butadiene polymers having a number average molecular weight in the range of about 1,000 to about 10,000. Acid groups are present in the copolymer sufficient to give an acid content in the range of 0.05 to 0.15 ephr carboxyl groups. Butadiene/(meth)acrylic acid copolymers are preferred.

As mentioned above, the low molecular weight copolymer (b) also has at least one ethylenically unsaturated group on its molecule. The use of compound (b) not only provides the butadiene segments which yield a more flexible and softer composition, but also the ethylenically unsaturated groups which provide for more crosslinking sites. The additional sites increase the crosslinking density of the formulation, thus rendering the cured composition more solvent resistant.

When it is desired to further enhance the photocurability, solvent resistance and water dispersibility of the photocurable composition, the low molecular weight butadiene/(meth)acrylic acid copolymer (b) can also be modified and maleated by the same compounds used on the acid-containing copolymer (a).

In a method of preparing the low molecular weight copolymer (b), a hydroxy terminated polybutadiene is modified by a first reaction of the hydroxyl groups with maleic anhydride, a second reaction as described in connection with copolymer (a) with the above-mentioned compound having an ethylenically unsaturated group and an acid reactive group, preferably GMA, and a third optional reaction with maleic anhydride. See U.S. Pat. No. 4,857,434 issued to Klinger Aug. 15, 1989, which is incorporated herein by reference. Briefly, in this method, it is preferable that the modified hydroxy terminated polybutadiene is liquid, has a molecular weight of about 1,000–10,000 acid content of about 0.05–0.15 ephr. A specific example is 55SR™ available from the Polyfibron Division of W. R. Grace & Co.-Conn.

As indicated earlier, the free ethylenically unsaturated groups on the low molecular weight copolymer (b) add to the solvent resistance of the photocurable composition after it is cured. Those groups not only create additional crosslinking when they crosslink among themselves, but they also create additional crosslinking sites for reaction with ethylenically unsaturated groups on the acid-containing copolymer and any reactive monomer that may be used in the photocurable composition. The added solvent resistance will be beneficial in preventing dissolution of the cured areas in developing media.

Even further, by using copolymers with a significant acid content, the modification described results in a photocurable composition which is water dispersible. In other words, even though the carboxyl groups on the copolymers are modified, there are enough carboxyl groups remaining after that reaction to impart additional water dispersibility.

The reaction between the compound having the ethylenically unsaturated group and both copolymers (a) and (b) depends on the acid reactive group on the former. As illustrated by a reaction with GMA, the reaction can be run for 3 to 50 hours, and preferably 25 to 40 hours between 25° C. and 200° C. at a preferred temperature of about 100° C. A suitable solvent for the reaction is chlorobenzene, although other solvents and solvent mixtures can be used.

Catalysts may also be used to reduce the required reaction temperature and time. Suitable catalysts include sodium hydroxide, sodium ethoxide, triethylbenzyl ammonium chloride, hydrogen chloride, boron trifluoride and tertiary amines such as trimethylamine or benzyldimethylamine. A preferred catalyst is 1,8-diazabicyclo [5.4.0] undec-7-ene. Generally, about 0.1–2% by weight catalyst can be used, with about 0.5% by weight being preferred.

Subsequent to a GMA modification, the water dispersibility of the modified composition can be further enhanced by reacting the composition with an anhydride. Suitable anhydrides include those having the formula below:

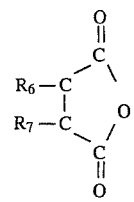

wherein $R_6$ and $R_7$ are individually a member of the group consisting of hydrogen, halogen, carboxyl, linear or cyclic alkyl containing 1–20 carbon atoms, aryl, alkaryl and aralkyl containing 6 to 20 carbon atoms. Maleation of either copolymer or both is desirable when there is a need to increase the water dispersibility of the overall photocurable composition and there are anhydride reactive groups produced as a result of the reaction with the ethylenically unsaturated group containing compound. The dispersibility of the compound is increased by maleation because of the creation of additional carboxyl groups.

Preferably all of the anhydride reactive groups will be maleated, i.e. the maleic anhydride is added in stoichiometric amount to any hydroxyl groups present. However, it is not necessary to completely maleate all of those groups.

When GMA and maleic anhydride are used in the modification and maleation reactions, the above-described maleation reaction creates a side chain having the structure:

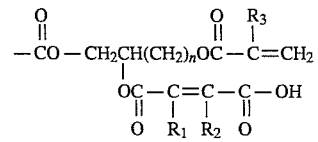

where $R_1$ and $R_2$ are individually a member of the group consisting of hydrogen, halogen, carboxyl, linear or cyclic alkyl containing 1–20 carbon atoms, aryl, alkaryl and aralkyl containing 6 to 20 carbon atoms; $R_3$ is hydrogen or methyl; and n is 1 to 6. The maleation reaction is typically carried out at a temperature in the range 60°–120° C. for periods ranging from 4–12 hours. The reaction is preferably carried out in the presence of a thermal inhibitor, such as di-t-butyl cresol, and in inert solvents such as a toluene, benzene, chloroform, methylene chloride, tetrahydrofuran, acetone and ethyl acetate. Although no catalysts are necessary, catalytic amounts of acids or Lewis acids such as phosphoric acid and stannous octoate can be employed.

A photocurable composition comprising the acid-containing copolymer (a) and the low molecular weight copolymer (b) (modified or unmodified) can then be solvent cast, "as is" to create a solid photocurable layer on photosensitive articles. However, it is preferable to formulate the photocurable composition with a reactive monomer. When such monomers are used, the extent of their addition is limited by the attending increase in Shore A hardness and decrease in flexibility. A suitable amount of monomer would be in the range of about 1 to 20% by weight, and most preferably in the range of 5 to 15% by weight reactive monomer. Suitable reactive monomers are those of the formula:

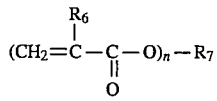

wherein $R_6$ is hydrogen or methyl, and $R_7$ is an organic moiety having the valence of n, and n is 1 or more. Such reactive acrylic diluents include, but are not limited to, trimethylolpropane triacrylate, hexanediol diacrylate, 1,3-butylene glycol diacrylate, diethylene glycol diacrylate, 1,6-hexanediol diacrylate, neopentyl glycol diacrylate, polyethylene glycol 200 diacrylate, tetraethylene glycol diacrylate, triethylene glycol diacrylate, pentaerythritol tetraacrylate, tripropylene glycol diacrylate, ethyloxylated bisphenol-A diacrylate, trimethylolpropane diacrylate, ditrimethylolpropane tetraacrylate, triacrylate of tris(hydroxyethyl) isocyanurate, dipentaerythritol hydroxypentaacrylate, pentaerythritol triacrylate, ethoxylated trimethlyolpropane triacrylate, triethylene glycol dimethacrylate, ethylene glycol dimethacrylate, tetraethylene glycol dimethacrylate, polyethylene glycol-200 dimethacrylate, 1,6-hexanediol dimethacrylate, neopentyl glycol dimethacrylate, polyethylene glycol-600 dimethacrylate, 1,3-butylene glycol dimethacrylate, ethoxylated bisphenol-A dimethacrylate, trimethylolpropane trimethacrylate, diethylene glycol dimethacrylate, 1,4-butanediol diacrylate, diethylene glycol dimethacrylate, pentaerythritol tetramethacrylate, glycerin dimethacrylate, trimethylolpropane dimethacrylate, pentaerythritol trimethacrylate, pentaerythritol dimethacrylate, pentaerythritol diacrylate and the like which can be added to the photopolymerizable composition to modify the cured product. Monoacrylates such as cyclohexyl acrylate, isobornyl acrylate, lauryl acrylate and tetrahydrofurfuryl acrylate and the corresponding methacrylates are also operable as reactive diluents.

Photoinitiators for the photocurable composition and formulations containing the same include the benzoin alkyl ethers, such as benzoin methyl ether, benzoin ethyl ether, benzoin isopropyl ether and benzoin isobutyl ether. Another class of photoinitiators are the dialkoxyacetophenones exemplified by 2,2-dimethoxy-2-phenylacetophenone, i.e. Irgacure®651 (Ciba-Geigy) and 2,2-diethoxy-2-phenylacetophenone. Still another class of photoinitiators are the aldehyde and ketone carbonyl compounds having at least one aromatic nucleus attached directly to the carboxyl group. These photoinitiators include, but are not limited to benzophenone, acteophenone, o-methoxybenzophenone, acenaphthenequinone, methyl ethyl ketone, valerophenone, hexanophenone, alpha-phenyl-butyrophenone, p-morpholinopropiophenone, dibenzosuberone, 4-morpholinobenzophenone, 4'-morpholinodeoxybezoin, p-diacetylbenzene, 4-aminobenzophenone, 4'-methoxyacetophenone, benzaldehyde, alpha-tetralone, 9-acetylphenanthrene, 2-acetylphenanthrene, 10-thioxanthenone, 3-acetylphenanthrene, 3-acetylindone, 9-fluorenone, 1-indanone, 1,3,5-triacetylbenzene, thioxanthen-9-one, xanthene-9-one, 7-H-benz[de]-anthracen-7-one, 1-naphthaldehyde, 4,4'-bis(dimethylamino)-benzophenone, fluorene-9-one, 1'-acetonaphthone, 2'-acetonaphthone, 2,3-butanedione, acetonaphthene, benz[a]anthracene 7.12 diene, etc. Phosphines such as triphenylphosphine and tri-o-tolylphosphine are also operable herein as photoinitiators. The photoinitiators or mixtures thereof are usually added in an amount ranging from 0.01 to 5% by weight of the total composition.

Other additives to the photocurable composition can be included. To inhibit premature crosslinking during storage of the photocurable compositions described herein, thermal polymerization inhibitors and stabilizers are added. Such stabilizers are well known in the art, and include, but are not limited to, hydroquinone monobenzyl ether, methyl hydroquinone, amyl quinone, amyloxyhydroquinone, n-butylphenol, phenol, hydroquinone monopropyl ether, phenothiazine and nitrobenzene, and mixtures thereof. Such additives are used in an amount within the range of from about 0.01 to about 2% by weight of the photocurable composition. These stabilizers are effective in preventing crosslinking of the composition during preparation, processing and storage.

The compositions also may contain up to about 50% by weight of an inert particulate filler which is essentially transparent to actinic light. Such fillers include the organophilic silicas, bentonites, silica and powdered glass. Such fillers can impart desirable properties to the photocurable compositions and reliefs on printing plates containing those compositions.

The photocurable composition can then be shaped and formed as a solid layer of suitable thickness according to conventional solvent casting, i.e. dissolving the composition in a solvent, shaping the solution into a film or plate and removing the solvent. Conventional extrusion calendaring or hot press techniques can also be used. Solid layers of the photocurable composition in the form of a film can be adhered to supports such as those comprising polyester, nylon or polycarbonate. Other suitable supports include woven fabrics and mats, e.g. glass fiber fabrics or laminated materials made of, for example, glass fibers and plastics. It is preferred that the supports are dimensionally stable and resistant to the washout solutions.

It is also usually necessary to protect photosensitive surfaces from contamination by dirt and dust during storage before being exposed and washed. Such protection is accomplished by lamination or application of a protective cover sheet to the side of the photocurable composition opposite that of the support. In addition, the photocurable compositions can sometimes be tacky and it is thus also desirable to apply a release film to the surface of the photocurable layer before application of the coversheet. The release film may consist of a thin, flexible and water dispersible polymeric film and allows for intimate contact between the surface of the photocurable composition opposite to the support and an image bearing negative applied to the surface.

Photosensitive articles comprising a support and a solid layer or surface comprising the photocurable composition, e.g. solid flexographic printing plates, can then be processed by well known techniques for imagewise exposure to actinic light. Preferably, the light should have a wavelength of from about 230–450 nm. Exposure is through a negative placed between the light source and the photosensitive surface. Suitable sources of light include Type RS sunlamps, carbon arc lamps, xenon arc lamps, mercury vapor lamps, tungsten halide lamps and the like.

Exposure periods depend upon the intensity of the actinic light, thickness of the plate and the depth of the relief desired on the printing plate. Periods of from 2 to 20 minute exposures are preferred.

After exposure and the negative has been removed, the unexposed areas of the photocurable layer can be developed in aqueous solutions. Suitable solutions include those of nonionic and cationic surfactants, as well as basic and semi-aqueous basic solutions and combinations thereof. Such surfactants are commercially available as Triton® X-100 (non-ionic) and Triton RW-150 (cationic) from Rohm & Haas Company.

Flexible photosensitive articles having a Shore A hardness of 60 or less and elongation of at least 100%, preferably at least 250% result from the above-described photocurable compositions. It has been found that, typically, articles meeting these requirements are flexible enough to wrap around printing plate cylinders, especially those used in printing on elastic commercial packaging film surfaces. Further, an accurate transfer of ink to the flexible, elastic packaging film surfaces is obtained from flexible and soft printing plates whose photocurable layer is prepared from the above-described photocurable composition. Moreover, the aforesaid flexible plates also possess sufficient strength to withstand the normal rigors experienced in a printing operation, as evidenced by their tensile strength and Young's modulus.

In order to further illustrate the practice of the present invention, the following examples are provided. However, these examples are in no way meant to be limiting, but merely illustrative. Unless indicated otherwise, all amounts in the examples below are in parts by weight.

Example 1

Preparation of copolymer (b)

500 parts hydroxy-terminated polybutadiene having a number average molecular weight of about 4750 was sequentially reacted with 17 parts maleic anhydride for eight (8) hours, 25 parts glycidyl methacrylate for twelve (12) hours, and 8 parts maleic anhydride for eight (8) hours. Total reaction time was 28 hours. Temperature was maintained at 80° C. at all times. The product had a viscosity greater than 2,000,000 cps at 25° C.

Mixing and Formulation 2500 parts (a), a solid butadiene-methacrylic acid copolymer having an acid content of 0.3 ephr and a Mooney viscosity of about 50 (from Zeon Chemicals, formerly The Elastomers Division of B. F. Goodrich) and 775 parts (b) were dissolved along with 300 parts of isobornyl methacrylate, 150 parts of lauryl methacrylate and 63 parts of 2,2-dimethoxy-2-phenylacetophenone in approximately 5000 parts of tetrahydrofuran. The resulting solution was then coated by multiple passes onto a carrier sheet, dried to a uniform clear coating of 67 mil thickness. The coated sheet was then exposed through a negative with U.V. light and washed in 5% $Na_2CO_3$ solution at 60° C. with mechanical brushing. The resulting plate had a raised image with 35 mil relief, good printing qualities and excellent mechanical properties, i.e. Shore A hardness of 52, elongation of 434%, tensile strength of 337 psi and a Young's modulus of 328 psi, to drape around a 3 inch printing cylinder.

Example 2

Preparation of Modified Copolymer (a)

200 parts of a solid butadiene-methacrylic acid copolymer (a) described in Example 1 were dissolved in 450 parts of toluene and 150 parts of 1-butanol in a resin kettle. The polymer solution was maintained at 50° C. and 16.4 parts of diethylaminoethyl methacrylate were added and mixed for 1 hour to partially ionomerize the copolymer.

Addition of Copolymer (b)

62 parts of the copolymer (b) described above in Example 1, 24 parts of isobornyl methacrylate, 12 parts of lauryl methacrylate and 3.9 parts of 2,2-dimethoxy-2-phenyl acetophenone were added to the resin kettle and mixed at room temperature.

A solvent-cast film prepared from this formulation was solid, photosensitive and dispersible in weak alkaline aqueous solutions. The photocured film possessed the following mechanical properties: 573% elongation, 332 psi tensile strength, 397 psi modulus and 50 Shore A hardness.

Example 3

Preparation of Modified Copolymer (a).

64 parts of copolymer (a) were dissolved in 144 parts of butyl acetate. Some of the copolymer acid groups were reacted with 1.4 parts of glycidyl methacrylate (GMA) for about 22 hours at 90° C. in a resin kettle with 1,8-diazabicyclo [5.4.0] undec-7-ene as catalyst. Also, 0.9 parts of GELTROL® (antioxidant, B. F. Goodrich), 1.54 parts of decane (an internal standard for gas-liquid chromatography "GLC" analysis) and 12 drops of nitrobenzene (stabilizer) were added. The OH groups from the GMA adduction were then reacted with 0.97 parts of maleic anhydride at 90° C. for about three hours.

Addition of Copolymer (b)

The modified copolymer (a) was then mixed with 20 parts of the copolymer (b) described in Example 1, 15 parts of tetrahydrofurfuryl methacrylate and 1 part of 2,2-dimethoxy-2-phenyl acetophenone. As with the earlier examples, the solvent-cast film prepared from this formulation was solid, photosensitive and dispersible in weakly alkaline solutions. Also, the cured film was elastomeric and strong and had the following mechanical properties: 336% elongation, 640 psi modulus, 907 psi tensile strength and 48 Shore A hardness.

What is claimed:

1. A photocurable composition comprising
   (a) a solid butadiene/methacrylic acid copolymer having an acid ephr of at least 0.2, and
   (b) a liquid acid-containing polymer having a weight average molecular weight of about 1000 to 10,000 suitable for flexibilizing the photocurable composition when cured, wherein said liquid acid-containing polymer has at least one free ethylenically unsaturated group and is the reaction product of a liquid butadiene/methacrylic acid copolymer and glycidyl methacrylate, or said liquid acid-containing polymer is the reaction product of (i) a hydroxy-terminated polybutadiene, (ii) maleic anhydride, and (iii) a compound having a free ethylenically unsaturated group and a free acid reactive group, and wherein the liquid acid-containing polymer (b) is further reacted with an anhydride.

2. A photocurable composition according to claim 1 wherein (iii) is glycidyl methacrylate.

3. A photocurable composition according to claim 2 wherein the anhydride further reacted with the liquid acid-containing polymer (b) is maleic anhydride.

4. A photocurable composition according to claim 1 further comprising an ethylenically unsaturated monomer and a photopolymerization initiator.

5. A photocurable composition according to claim 1 wherein said butadiene/methacrylic acid copolymer of (a) is reacted with a compound having a free ethylenically unsaturated group and a free acid reactive group.

6. A photocurable composition according to claim 5 wherein the compound having the free ethylenically unsaturated group and the free acid reactive group is glycidyl methacrylate.

7. A photocurable composition according to claim 1 wherein said butadiene/methacrylic acid copolymer of (a) is reacted with a nitrogen-containing compound having an ethylenically unsaturated group.

8. A photocurable composition according to claim 7 wherein the nitrogen-containing compound is diethylaminoethyl methacrylate.

9. A flexible photosensitive article comprising a substrate and a solid photocurable layer thereon, the layer comprising a photocurable composition according to one of claims 1, 2–6, 7 or 8.

10. A method of making a photocurable layer, the improvement comprising combining (a) a solid butadiene/ methacrylic acid copolymer having an acid ephr of at least 0.2 with (b) a liquid acid-containing polymer having a weight average molecular weight of about 1000 to 10,000 suitable for flexibilizing the photocurable layer, wherein said liquid acid-containing polymer has at least one free ethylenically unsaturated group and is the reaction product of a liquid butadiene/methacrylic acid copolymer and glycidyl methacrylate, or said liquid acid-containing polymer is the reaction product of (i) a hydroxy-terminated polybutadiene, (ii) maleic anhydride, and (iii) a compound having a free ethylenically unsaturated group and a free acid reactive group, and wherein the liquid acid-containing polymer (b) is further reacted with an anhydride.

11. A method according to claim 10 wherein (iii) is glycidyl methacrylate.

12. A method according to claim 11 wherein the anhydride further reacted with the liquid acid-containing polymer (b) is maleic anhydride.

13. A method according to claim 10 wherein the photocured layer further comprises ethylenically unsaturated monomer and photoinitiator.

14. A method according to claim 10 wherein said butadiene/methacrylic acid copolymer of (a) is reacted with a compound having a free ethylenically unsaturated group and a free acid reactive group.

15. A method according to claim 14 wherein the compound having the free ethylenically unsaturated group and free acid reactive group is glycidyl methacrylate.

16. A method according to claim 10 wherein said butadiene/methacrylic acid copolymer of (a) is reacted with a nitrogen-containing compound having a free ethylenically unsaturated group.

17. A method according to claim 16 wherein the nitrogen-containing compound is diethylaminoethyl methacrylate.

* * * * *